United States Patent [19]

Hamada et al.

[11] Patent Number: 5,587,918
[45] Date of Patent: Dec. 24, 1996

[54] CIRCUIT PATTERN COMPARISON APPARATUS

[75] Inventors: Susumu Hamada, deceased, late of Mitaka, by Nozomu Hamada, heir; Dai Araki, Yokohama, both of Japan

[73] Assignee: Kabushiki Kaisha Toshiba, Kawasaki, Japan

[21] Appl. No.: 173,082

[22] Filed: Dec. 27, 1993

[30] Foreign Application Priority Data

Dec. 28, 1992 [JP] Japan ................................. 4-349323
Feb. 19, 1993 [JP] Japan ................................. 5-030914

[51] Int. Cl.$^6$ ............................................. H01L 25/00
[52] U.S. Cl. ........................... 364/488; 364/489; 364/490; 364/491
[58] Field of Search ............................... 364/488, 489, 364/490, 491, 578

[56] References Cited

U.S. PATENT DOCUMENTS

| | | | |
|---|---|---|---|
| 4,651,284 | 3/1987 | Watanabe et al. | 364/491 |
| 4,791,586 | 12/1988 | Maeda et al. | 364/491 |
| 4,813,013 | 3/1989 | Dunn | 364/900 |
| 4,852,019 | 7/1989 | Vinberg et al. | 364/521 |
| 5,046,012 | 9/1991 | Morishita et al. | 364/488 |
| 5,111,413 | 5/1992 | Lazansky | 364/578 |
| 5,202,841 | 4/1993 | Tani | 364/491 |
| 5,287,290 | 2/1994 | Tabara et al. | 364/489 |
| 5,359,534 | 10/1994 | Fujiki et al. | 364/489 |
| 5,388,054 | 2/1995 | Tokumaru | 364/490 |
| 5,416,717 | 5/1995 | Miyama et al. | 364/488 |

OTHER PUBLICATIONS

Pelz et al., "Circuit Comparison by Hierarchical Pattern Matching", Computer Aided Design, 1991 Int. Conf., 1991, pp. 290–293.

"An Approach to Similarity Retrieval of Images by Using Shape Features", Kurokawa et al., Transactions of Information Processing Society of Japan, 32(6):721–730, 1991.

Primary Examiner—Kevin J. Teska
Assistant Examiner—Stephen J. Walder, Jr.
Attorney, Agent, or Firm—Finnegan, Henderson, Farabow, Garrett & Dunner, L.L.P.

[57] ABSTRACT

A circuit pattern comparison apparatus of the present invention comprises a search pattern editing unit for extracting portions matched to the designated search patterns from a target object represented as a circuit network including a set of nodes and node-to-node arcs or links and for schematically describing the search pattern and a search code synthesizing unit for synthesizing a search code by a code-converting the search pattern schematically described by the search pattern editing unit. The apparatus further comprises a comparing unit for receiving the search code synthesized by the search code synthesizing unit and for comparing the search patterns with the target object and extracting portions matched to the search patterns represented as the search code.

29 Claims, 11 Drawing Sheets

```
# PATTERN START REDUNDANCY RESISTOR REDUCTION

RESISTOR                                    1 (2)
CONNECTION LINE                             2 (1)(3)
RESISTER                                    3 (2)

# PATTERN END
```

FIG. 7

| | | | | |
|---|---|---|---|---|
| NPN | TRANSISTER | TR1 | N1 — | N2 |
| NPN | TRANSISTER | TR2 | N1 N4 | N3 |
| NPN | TRANSISTER | TR3 | N1 N6 | N5 |
| NPN | TRANSISTER | TR4 | N1 — | N5 |
| NPN | TRANSISTER | TR5 | N3 N7 | N9 |
| REGISTOR | | R1 | N2 | N3 |
| REGISTOR | | R2 | N1 | N4 |
| REGISTOR | | R3 | N4 | N6 |
| REGISTOR | | R4 | N6 | N8 |
| REGISTOR | | R5 | N8 | N9 |
| CAPACITOR | | C1 | N7 | N9 |
| CAPACITOR | | C2 | N5 | N9 |
| CONNECTION LINE | | N1 | | |
| CONNECTION LINE | | N2 | | |
| CONNECTION LINE | | N3 | | |
| CONNECTION LINE | | N4 | | |
| CONNECTION LINE | | N5 | | |
| CONNECTION LINE | | N6 | | |
| CONNECTION LINE | | N7 | | |
| CONNECTION LINE | | N8 | | |
| CONNECTION LINE | | N9 | | |

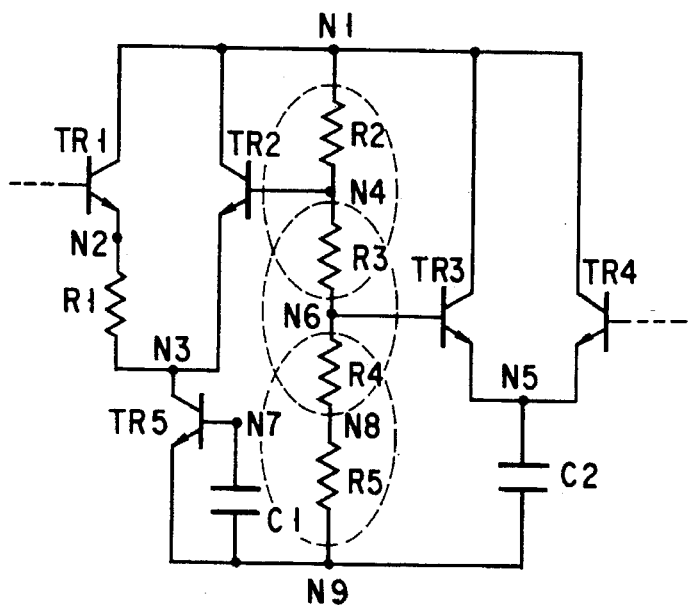

FIG. 9

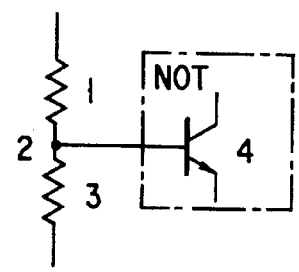

FIG. 10

```
# PATTERN START REDUNDANCY RESISTOR REDUCTION
RESISTOR                                    1 (2)
CONNECTION LINE                             2 (4 BASE)(1 X 3)
RESISTOR                                    3 (2)
# NOT START 1
NPN  TRANSISTOR                             4 (2 BASE)
# NOT END 1
# PATTERN END
```
FIG. 11
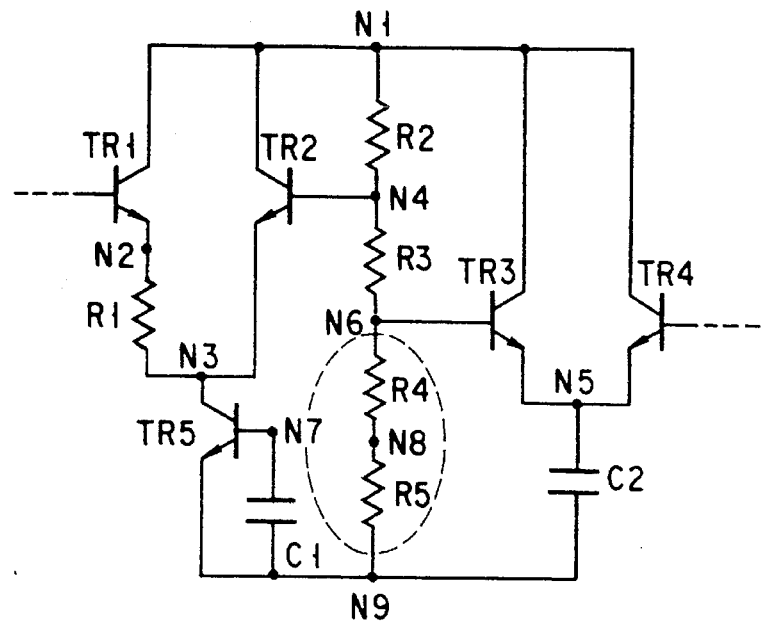
FIG. 12
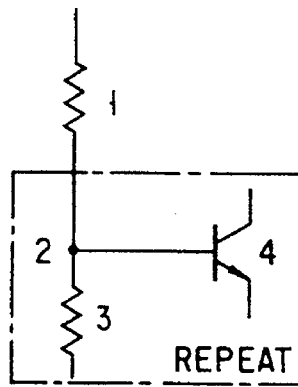
FIG. 13

```
# PATTERN START CONSTANT VOLTAGE CIRCUIT 1
RESISTOR                                    1 (2)
# REPEAT START 1 CONNECTION LINE            2 (1)(3)(4 BASE)
RESISTOR                                    3 (2)(5)
NPN TRANSISTOR                              4 (2 BASE)
# REPEAT RELATIVE 1 CONNECTION LINE         5 (3)(6)(7 BASE)
RESISTOR                                    6 (5)
NPN TRANSISTOR                              7 (5 BASE)
# REPEAT END 1
# PATTERN END
```
F I G. 14
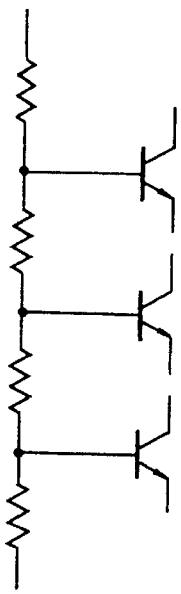
F I G. 15A
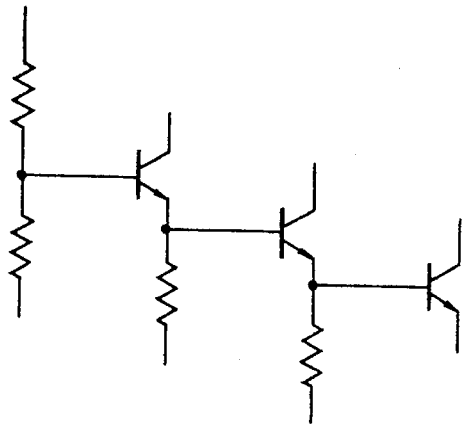
F I G. 15B

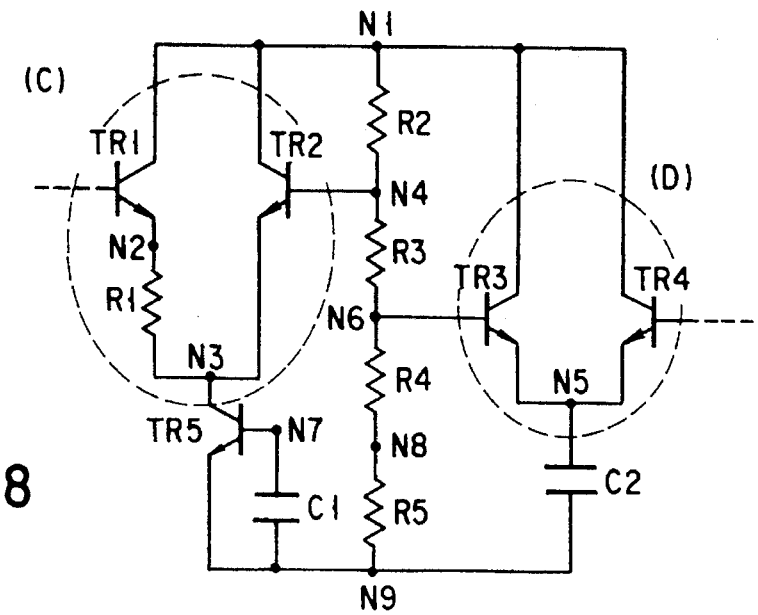
FIG. 18
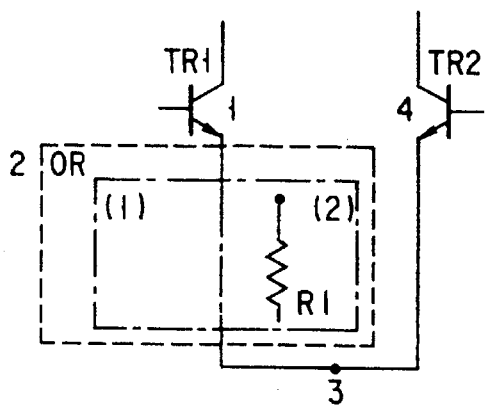
FIG. 19
```
#PATTERN START AMPLIFIER CIRCUIT 1
NPN TRANSISTOR                    1(2 EMITTER)
# OR START 1 CONNECTION LINE      2(1)(3)
RESISTOR                          3(2)
# OR 1
# OR END 1
CONNECTION LINE                   4(3)(5)
NPN TRANSISTOR                    5(4 EMITTER)
# PATTERN END
```
FIG. 20

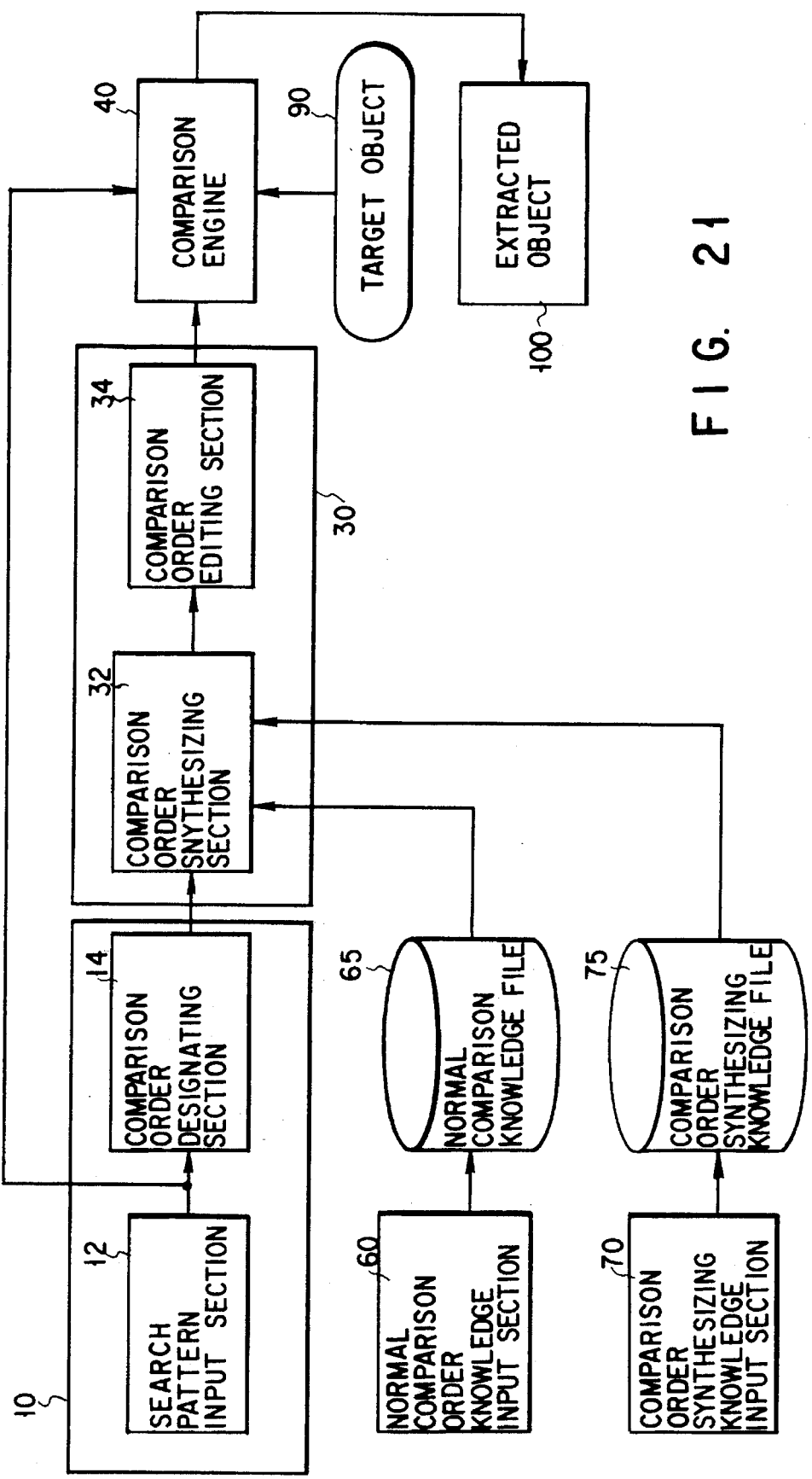
F I G. 21

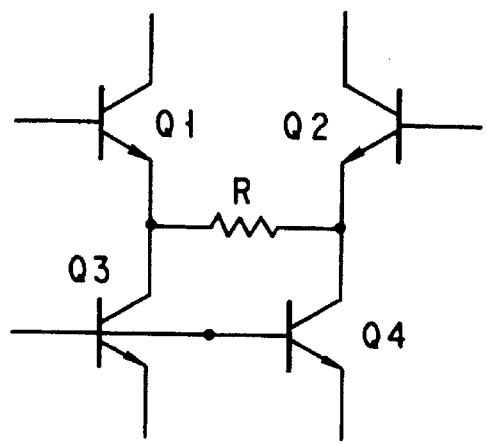
F I G. 22
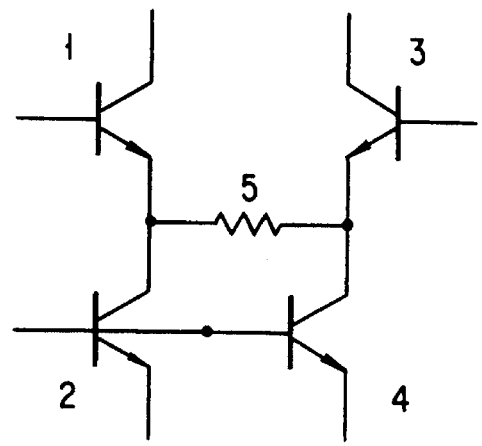
F I G. 23
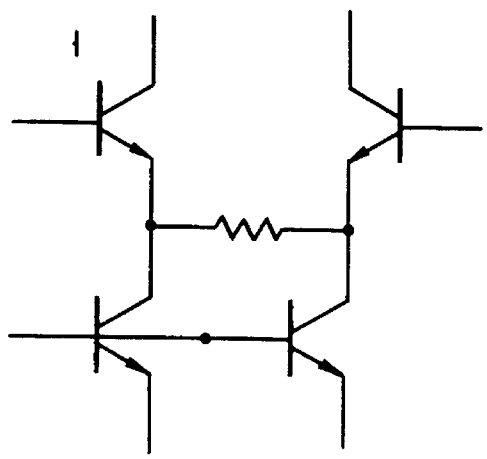
F I G. 24
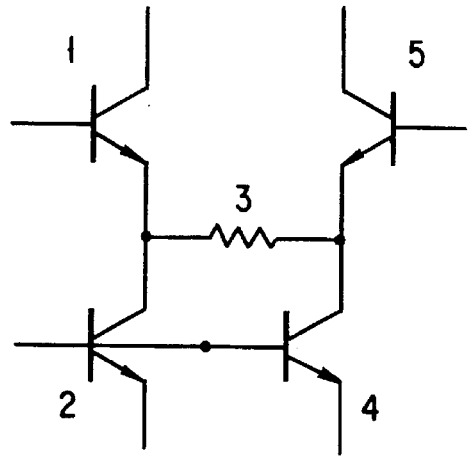
F I G. 25

CIRCUIT PATTERN COMPARISON APPARATUS

BACKGROUND OF THE INVENTION

1. Field of the Invention

The present invention relates to a circuit pattern comparison apparatus and, in particular, a circuit pattern comparison apparatus for searching portions matched to designated structural patterns from a target object represented as a circuit network whose physical structure or operation model comprises a set of nodes and node-to-node arcs or links.

2. Description of the Related Art

There is a demand for a circuit pattern comparison apparatus which, from a target object represented as a circuit network whose physical structure or operation model comprises a set of nodes and node-to-node arcs or links, portions matched to designated structural patterns (hereinafter referred to as search patterns) having a specific partial structure in the circuit network.

In practice, the pattern comparison method performs the following operations. In the designing of electronic circuits of various types of electronic apparatuses or logic circuits of semiconductor elements, the operation is directed to extracting structural features having a specific connection from a whole circuit arrangement and identifying any inconvenient portion. In the fault diagnosis of various types of plant, fault diagnosis of an electric power system, etc., the operation is directed to identifying a fault generation portion or portions of a schematic diagram on a whole system.

The circuit pattern comparison apparatus is utilized as a knowledge-based inference system for automatically performing these operations.

In those application areas of the designing of electronic circuits and logic circuits, for example, the structural designs of the circuit are described and edited by a design supporting tool, such as a CAD, and stored as a circuit data file represented as a circuit network comprising a set of nodes and node-to-node arcs or links. In this practical application, the pattern comparison apparatus treats the circuit network as a target object and finds faulty parts or inconvenient portions.

The first method for realizing a circuit pattern comparison apparatus is a procedural programming language for describing the operations which search the portions matched to the search patterns from a circuit network. Those search patterns contain heuristic procedure for discovering the target portions which satisfy structural conditions and local conditions about the attribute values of nodes or links.

In the procedural programming language, however, much labor is required in the description of a program for comparison. In the comparison program represented in the form of a procedural code, the user cannot intuitively understand its contents and it is also difficult to debug or correct them. That is, in the first method, the description of the individual comparison method is integrally incorporated in the procedure for the whole control operation of the circuit pattern comparison apparatus. It is, therefore, not easy to modify the partial description of the search pattern and comparison method.

The second pattern searching method is one for describing the comparison program under a "rule" form utilizing a production system. If the comparison program is described under the "rule" form, since a basic searching action is made utilizing a pattern matching function of the production system, less description can be achieved than in the procedural description and it is possible to readily build the circuit pattern comparison apparatus.

However, since the comparison program described under the "rule" form is represented in the form of a code, its contents cannot intuitively be understood as in the case of it being described by the procedural programming language, and it is difficult to debug and modify them. In this method, the inference engine (comparison engine) for realizing the comparison method has to obey a fixed inference mechanism of the production system and the change of the comparison method cannot be realized unless any specific ingenuity has been conceived, for example, under combination rules. Since the production system is a general-purpose problem solving apparatus irrespective of how an "object" problem is treated, it is difficult to compare the searching patterns at high speeds from the information of a circuit network having an exorbitant number of elements, such as an electric circuit realized by a semiconductor integrated circuit in particular.

Then since the description on the comparison order of the nodes and their local conditions are integrally incorporated, in the first method, in the nodes contained in the search pattern and the procedure for describing their condition, the change of the comparison order cannot readily be achieved. Even in the second method for describing the nodes contained in the search pattern and their condition and comparison order under the rule of the production system, it is not possible to designate their detailed order because the comparison order depends upon how it is written. The efficiency with which the pattern is searched is not good in the conventional methods.

Further, even in the above two methods it is necessary to designate the comparison order individually for the respective search pattern and the more types of search patterns the less searching efficiency of the pattern.

In the case where, in the prior art as set out above, those portions matched to the designated search patterns are to be searched from the target object represented by a circuit network comprised of a set of nodes and node-to-node arcs or links, since the nodes contained in the search pattern and comparison program for searching data satisfying their condition are described with a non-schematic representation, that is, the procedural programming language and rule form, the comparison contents represented by the comparison program cannot intuitively be understood and it is, therefore, difficult to debug and correct.

Further the procedure for searching portions matched to the search patterns which contain complex structures at a speed satisfied with a practical application and the comparison function considering the treatment of a fuzzy search pattern, etc., basically have to be developed as a program by the user himself or herself and it takes the user much time or labor to treat them.

SUMMARY OF THE INVENTION

The object of the present invention is to provide a circuit pattern comparison apparatus which can effectively search the desired portions from a target object represented as a circuit network comprising a set of nodes and node-to-node arcs or links.

In a first aspect of the present invention, a circuit pattern comparison apparatus has the following basic structure, that is, a circuit pattern comparison apparatus for searching portions matched to the designated search patterns from a target object which is represented by a circuit network composed of a set of nodes and node-to-node arcs or links, comprises search pattern editing means for schematically describing the search pattern; and search code synthesizing means for synthesizing the search code by subjecting, to code conversion, the schematically described search pattern.

The circuit pattern comparison apparatus further comprises comparing means for receiving the search code synthesized by the search code synthesizing means and for searching, the portions matched to the search pattern represented as the search code from the target object.

The following are desired embodiments of the present invention.

(a) The circuit pattern comparison apparatus is of such a type that the search pattern editing means includes means for designating, in the search pattern, a given pattern which is contained in the search pattern so as to be eliminated from the target object by negative comparison and the circuit pattern comparison apparatus is of such a type that the search code synthesizing means includes means for converting the given pattern which is schematically designated with the search pattern editing means for negative comparison to a search code contained as a negative comparison block and the comparing means includes means for determining that, when the pattern is not contained in the negative comparison block, comparison fails.

(b) The circuit pattern comparison apparatus is of such a type that the search pattern editing means includes means for schematically designating, in the search pattern, the given pattern for repeating comparison for repetitively comparing the given pattern; and the circuit pattern comparison apparatus is of such a type that the searching pattern editing means includes means for schematically designating, in the search pattern, a repeating structure representing a connection relation for repeating comparison; and the circuit pattern comparison apparatus is of such a type that the search code synthesizing means converts a pattern to be repetitively compared and a repeating structure to a search code contained as a repeating comparison block and the comparing means includes means for determining that, when the pattern contained in the repeating comparison block is repeated a predetermined number of times, comparison succeeds.

(c) In the embodiment (b), the circuit pattern comparison apparatus is of such a type that the comparing means includes means for determining that, when patterns to be compared are repeated a predetermined number of times in an overlapping way, searching succeeds only in the case where the number of repetitions is maximal.

(d) The circuit pattern comparison apparatus is of such a type that the search pattern editing means includes means for schematically designating a pattern for OR comparison which can search a designated pattern of the search pattern as any one of a plurality of patterns; and the circuit pattern comparison apparatus is of such a type that the search code synthesizing means includes means for converting the given position pattern to a search code contained as an OR type comparison block and the comparing means includes means for determining that, when the given position pattern is matched to any of the plurality of patterns, comparison succeeds.

(e) The circuit pattern comparison apparatus is of such a type that the searching pattern editing means includes means for schematically designating an omissible pattern in the search pattern; and the circuit pattern comparison apparatus is of such a type that the search code synthesizing means includes means for converting the omissible pattern as a search code contained as an omissible comparison block, and the comparing means includes means for determining that comparison succeeds irrespective of whether or not a matched pattern is found relative to the omissible block.

(f) The circuit pattern comparison apparatus further includes a specific comparison method describing unit for defining a desired comparison method, and a supplementary information input unit for searching the specific comparison method describing unit; and the circuit pattern comparison apparatus is of such a type that the pattern comparing means includes means for comparing the search pattern in accordance with the comparison method defined by the comparison method describing unit and the search pattern editing means includes means for starting the supplementary information input unit and for designating a specific unit for performing comparison in accordance with the specific comparison method describing unit.

In the first aspect of the present invention, the schematically described search pattern is code-converted to provide a search code and the search code is applied to a comparison engine. In comparison with the case where use is made of a procedural programming language and a comparison program is described under a rule format, it is possible to intuitively understand the contents of the search pattern and therefore to accurately and effectively perform pattern comparison, while achieving the easiness of debugging and modification.

Some of an aligned pattern, a pattern portion on which other than the normal comparison method is performed, can be designated schematically. Through schematic description even a specific and complex search pattern can specify the comparison method by applying, to the designated portion, not only the normal comparison method but also a negative comparison, a repeating type comparison, an OR type comparison, an omissible comparison or a specific comparison method prepared and registered by the user.

In a second aspect of the present invention a circuit pattern comparison apparatus is based on the concept of separating the description of the search pattern with the description on the designation of nodes in the search pattern and the designation of the comparison order of the nodes and condition.

To be specific, this circuit pattern comparison apparatus for searching the designated search pattern from a target object represented by a circuit network comprising a set of nodes and node-to-node arcs or links, basically comprises:

search pattern input means for inputting the search pattern;

comparison order designating means for designating a comparison order of those nodes contained in the search pattern input by the search pattern input means; and comparing means for comparing the search pattern with the target object in accordance with the comparison order designated by the comparison order designating means.

In a different phase, the above circuit pattern comparison apparatus for searching the designated search patterns from a target object represented by a circuit network comprising a set of nodes and node-to-node arcs or links, comprises:

search pattern input means for inputting the search pattern;

comparison order designating means for designating a comparison order of those nodes contained in the search pattern input by the search pattern input means;

normal comparison order knowledge input means for inputting normal comparison order knowledge not depending upon an individual pattern for the comparison order;

comparison order synthesizing means for combining normal comparison order knowledge input by the normal comparison order knowledge input means and the comparison order designated by the comparison order designating means and for synthesizing a new comparison order; and comparing means for comparing the search pattern with the target object in accordance with the comparison order synthesized by the comparison order synthesizing means.

This circuit pattern comparison apparatus further comprises comparison order synthesizing knowledge input means for inputting comparison order synthesizing knowledge for designating a method for synthesizing a new comparison order in the comparison order synthesizing means.

The circuit pattern comparison apparatus further comprises comparison order editing means for performing editing on the new comparison order synthesized by the comparison order synthesizing means.

In the second aspect of the present invention the circuit pattern comparison apparatus is of such a type that, due to the separation of the description of the input search pattern and description on the designation of the comparison order of nodes in the search pattern and their condition, readier description and maintenance can be achieved and the comparison order can be freely designated by the user.

By preparing the normal designated comparing method as the normal comparison knowledge, it is not necessary for the user to individually designate the designated search pattern. If the individual designation of the comparison order is necessary, it is possible to designate the comparison order by properly selecting a proper unit, such as data or condition, and to readily improve the efficiency with which comparison is made on the search pattern while designating and correcting the comparison order.

As set out above, the circuit pattern comparison apparatus according to the second aspect of the present invention can readily designate the comparison order and therefore it is possible to effectively retrieve a desired search pattern from the target object represented as a circuit network comprising nodes and arcs or links and therefore to save many times or labors as spent for the development of a high-efficient inference system.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 7 is a view showing circuit data on the electronic circuit of FIG. 6;

FIG. 9 is a view showing one form of a display output corresponding to a result of pattern comparison on the electronic circuit of FIG. 6;

FIG. 10 shows one form of a search pattern used on negative type comparison in the first embodiment;

FIG. 11 is a view showing one form of a search code corresponding to the search pattern in FIG. 10;

FIG. 12 is a view showing an example of a result of pattern comparison when negative type comparison is made on the electronic circuit of FIG. 6;

FIG. 13 is a view showing an example of a search pattern upon repeating comparison on the first embodiment;

FIG. 14 is a view showing one example of a search code corresponding to the search pattern of FIG. 13;

FIG. 15A is a view showing one form of various repeating structures in the search pattern in FIG. 13;

FIG. 15B is a view showing, for example, the repeating structure of a search pattern in FIG. 13;

FIG. 18 is a view showing, for example, a display output corresponding to a result of pattern comparison when OR type comparison is made on the electronic circuit of FIG. 6;

FIG. 19 shows, for example, a search pattern for use upon OR type comparison on the apparatus of the first embodiment;

FIG. 20 is a view showing, for example, a search pattern for use on OR type comparison on the apparatus of the first embodiment;

FIG. 21 is a block diagram showing an arrangement of a circuit pattern comparison apparatus according to a second embodiment of the present invention;

FIG. 22 is a view showing a search pattern for explaining the operation of the first embodiment;

FIG. 23 is a view showing one example designating the comparison order to a search pattern of FIG. 22;

FIG. 24 is a view showing one example partially designating a comparison order to a search pattern of FIG. 22; and FIG. 25 is a view showing another example designating a comparison order to a search pattern of FIG. 22.

DETAILED DESCRIPTION OF THE PREFERRED EMBODIMENTS

The embodiments of the present invention will be explained below with reference to the accompanying drawings.

Figure 1:
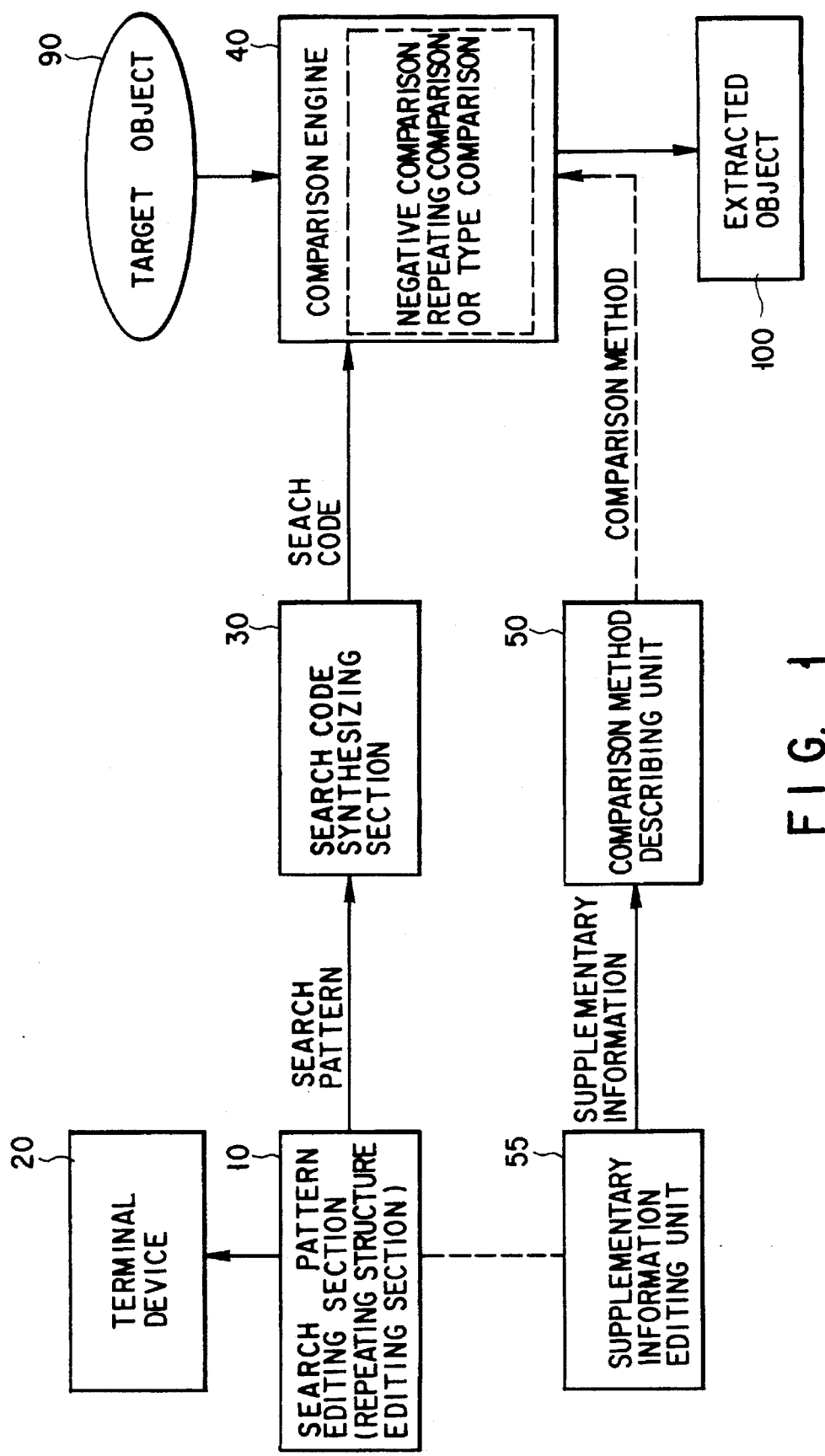
FIG. 1 is a block diagram showing a circuit pattern comparison apparatus according to a first embodiment of the present invention.

FIG. 1 is a block diagram showing a schematic arrangement of a circuit pattern comparison apparatus according to a first embodiment of the present invention.

The circuit pattern comparison apparatus of the present invention comprises a search pattern editing section 10, a terminal device 20, a search code synthesizing section 30 and a comparison engine 40. Further the circuit pattern comparison apparatus of the present invention includes a comparison method describing unit 50 and a supplementary information editing unit 55.

The search pattern editing section 10 comprises an editor for preparing and editing a search pattern to be extracted from the target object 90. The search pattern editing section 10 schematically describes the search pattern and, in addition, can schematically designate, a partial area on which some kind of abnormal comparison method called "specific comparison" (such as a negative comparison and repeating comparison) should be carried out. In connection with the embodiment below, explanation will be given below by taking an electronic circuit as the target object 90 and, in this case, those elements such as transistors and resistors correspond to nodes; the element-to-element connections correspond to arcs or links; and the whole circuit corresponds to a circuit network.

Figures 2, 4:
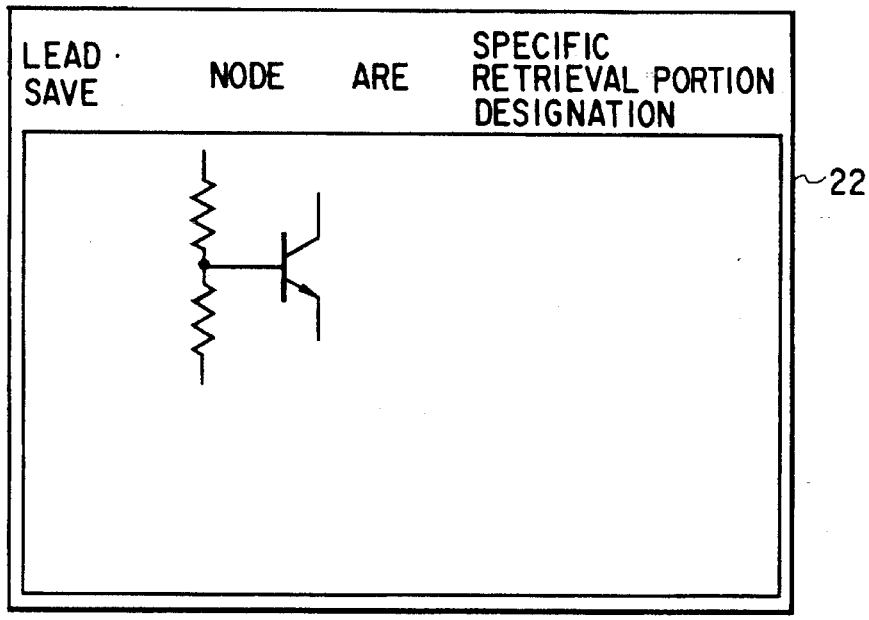
FIG. 2 is a view showing one form of a search pattern editing screen in the first embodiment.
FIG. 4 is a view showing one form of a schematically represented search pattern.

The terminal device 20 is controlled by the search pattern editing section 10 and displays a search pattern editing image screen as shown in FIG. 2. The search pattern editing screen 22 has an image screen (display section) for schematically displaying a search pattern prepared and edited by the user; a "load" button for reading the search pattern from a file, and a "save" button for writing it into a file; an "add node" button for adding the node to the search pattern, and "delete node" button for eliminating the node from the search pattern; an "add link" button for adding a link or arc to the search pattern, and a "delete link" button for eliminating it from the search pattern; and a "specific comparison area setting" button.

The search code synthesizing section 30 receives data corresponding to a schematically represented search pattern output from the search pattern editing section and synthesizes a code (a code for comparing) treatable by the comparison engine 40.

The comparison engine 40 receives the search code synthesized by the search code synthesizing section 30 and extracts, from the target object, portions matched to the search pattern represented as the comparison code.

The comparison method describing unit 50 designates, as the comparison method at the comparison engine 40, not only a normal comparison method but also, for example, a specific comparison method such as a negative comparison, a repeating type comparison, an OR type comparison or any specific comparison method prepared and registered by the user.

The supplementary information editing unit 55 as set out above is used to define a relationship between those two repeating structures at the repeating comparison as will be set out below in more detail.

Figure 3:
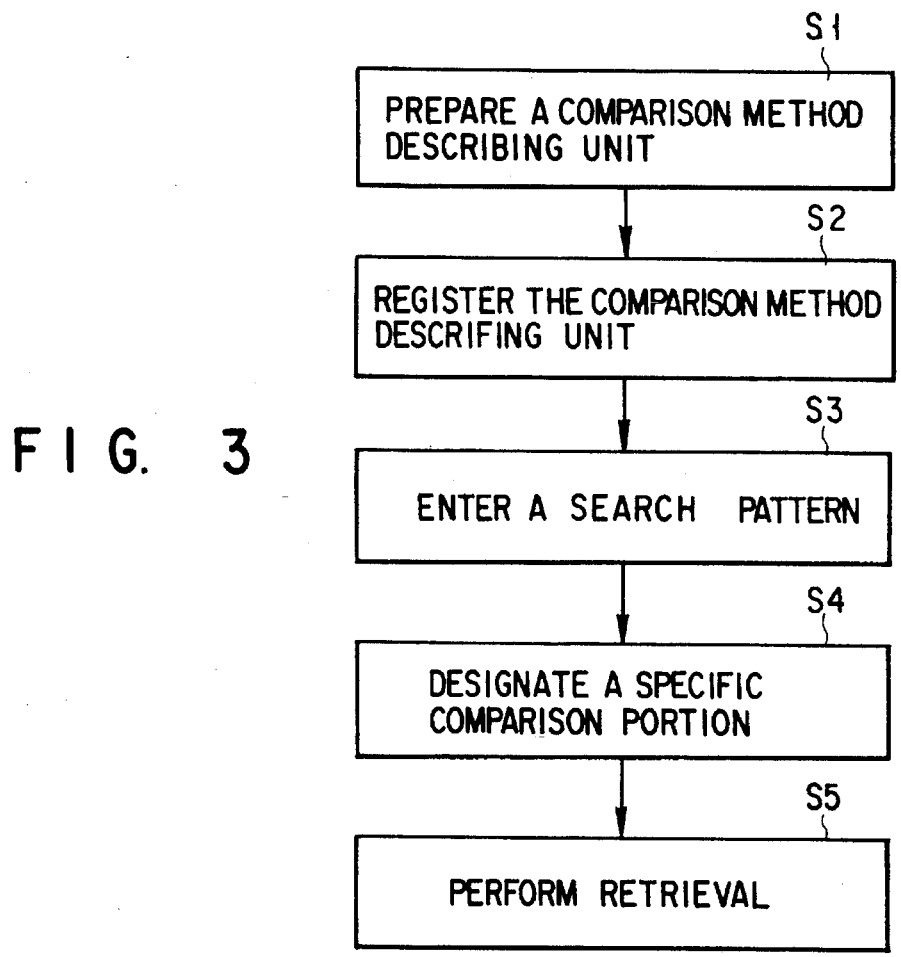
FIG. 3 is a flow chart diagrammatically showing a processing flow of pattern comparison on the apparatus of the first embodiment.

The general operation of the circuit pattern comparison apparatus (the first embodiment) as a whole will be explained below with reference to FIG. 3. FIG. 3 shows a control flow chart showing a flow of schematic processing on pattern comparison by the circuit pattern comparison apparatus according to the first embodiment.

The comparison method describing unit 50 is prepared with the use of the terminal device 20 (Step S1). In Step S2, the comparison method describing unit 50 prepared by the terminal device 20 is registered in the file (not shown).

In Step S3, a search pattern is entered by the search pattern editing section 10 while viewing the search pattern editing screen 22 of the peripheral unit 20. A specific comparison area is designated as required (Step S4). The comparison engine 40 executes a pattern extracting operation from the target object 90 (Step S5).

In the case where any new comparing method is not required in the above operation, those operations as at Steps S1 and S2 are omitted.

Now explanation will be given below regarding the detailed arrangement and detailed operation on respective parts of the circuit pattern comparison apparatus according to the first embodiment of FIG. 1.

FIG. 4 shows one example of schematically represented search pattern data prepared or edited by the search pattern editing section 10 in the case where a circuit network arrangement with two mutually connected resistors is defined as comparison data.

Figures 5, 6:
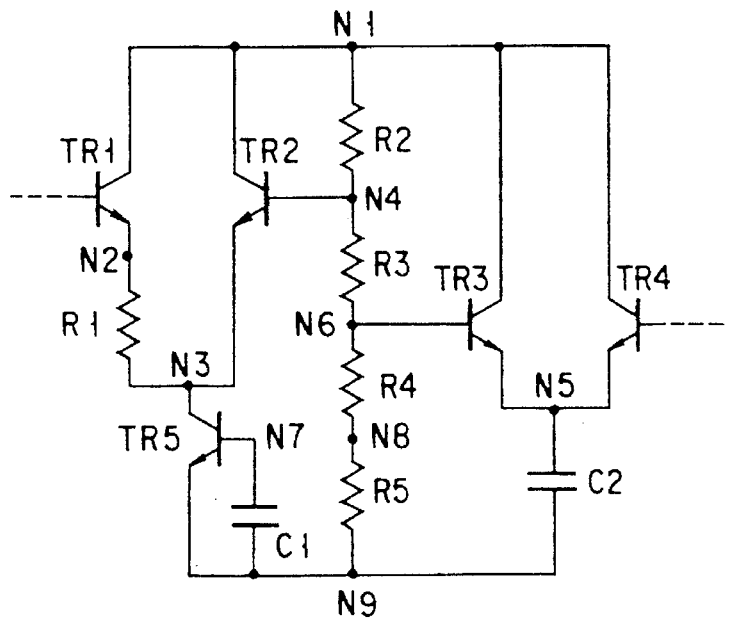
FIG. 5 is a view showing one form of a search code corresponding to the search pattern in FIG. 4.
FIG. 6 is a view showing an electronic circuit of one form of a target object in the first embodiment.

FIG. 5 shows one example of a search code synthesized by the search code synthesizing section 30 on the basis of the search pattern data of FIG. 4.

In FIG. 5, a first line means a start of pattern data, that is, a start of the data on a search pattern named "a redundancy resistor reduction." The second to the fourth lines emerging in FIG. 5, each, represent those information items, as a one-line-per node format, on the respective nodes contained in the search pattern. Those information items on the respective nodes contain the type of nodes and the connections to any other nodes. In addition to such circuit network configuration, there are also the cases where, for example, same local conditions are given to the resistors, such as "resistors of above 10 ohms" and local relationship such as "two resistors have the same type." In the embodiment as set out below, explanation will be given about the case where there are no such local conditions or local relationships.

First the contents of the second to fourth lines in FIG. 5 will be explained below in more detail. The node information items of the second to fourth lines contain the type of nodes, identification number (hereinafter referred to as an "ID number") of the nodes and connections to other nodes.

The second line shows that the node is a resistor where the ID number (the number is attached by the system to the node so as to distinguish from another resistor) is 1 and has a connection to another node indicated by the numeral "2" in parentheses. In this case, the register is connected to the connection line (third line) of the ID number 2. The third line shows that the node and ID number are the connection line and 2, respectively, and it is connected with resistors 1 and 3. The fourth line shows that the node and ID number are the resistor and 3 and the node is connected to the connection line 2.

The fifth line emerging in FIG. 5 shows the end of the search pattern data.

The first embodiment will be explained below by considering the case where pattern comparison is performed with an electronic circuit (FIG. 6) as a target. FIG. 6 shows an electronic circuit, in the first embodiment, which is one example of the target object. FIG. 7 shows those circuit data items relating to the electronic circuit of FIG. 6 and represents information items on the nodes in the respective lines.

In FIG. 7, the respective line includes the type, name and connection line information of each node. The connection information items of the respective node represent any specific connection line to which the node other than the connection line is connected. In the case of NPN transistors TR1 to TR5, for example, their collectors, bases and emitters are shown connected to associated connection lines and the NPN transistor TR1 is connected at its collector connected to a connection line N1, at its base to nothing ("–" shows no connection line to be connected) and at its emitter to a connection line N2.

Figure 8:
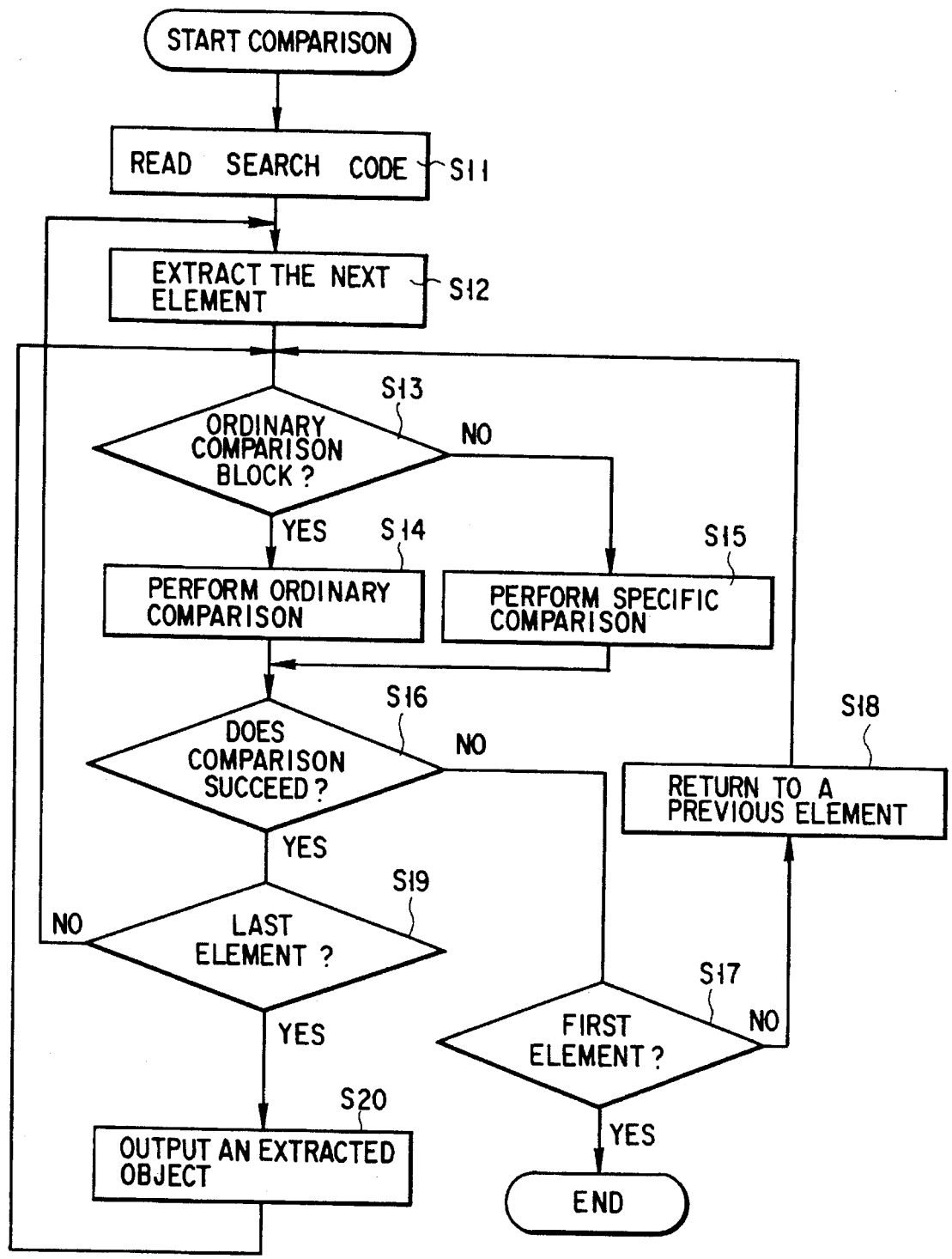
FIG. 8 is a flow chart showing a pattern comparison operation in a comparison engine in the first embodiment.

Referring to FIG. 8, the first operation of the comparison engine 40 will be explained below in connection with the case where the search pattern of FIG. 4 is compared with the circuit shown in FIG. 6. FIG. 8 is a flow chart showing the pattern comparison operation of the comparison engine in the first embodiment.

After the start of the comparison, the comparison engine 40 read the search code shown in FIG. 5 from the search code synthesizing section 30 and starts searching (steps S11 to S14). In the case shown in FIG. 5, a resistor of the second line is compared. In this case, the resistor on the second line shows an initial element and it is not possible to examine the condition under which the relation of its connection to another node exists. Comparison is made from the head (in FIG. 7), searching the type belonging to the resistor. The resistor R1 is extracted as the condition being met. The first element being thus found, the next element is taken out. In the case shown in FIG. 5, the connection line on the third line in FIG. 5 is compared, that is, comparison is continued for that connection line to which the already found resistor R1 is connected. The connection lines N2 and N3 are taken, upon comparison, out of the data shown in FIG. 7, but the connection line N2 is first examined.

The comparison engine 40 decides whether or not the comparing method is the normal comparison (step S13). If this is not the comparison, specific comparison is made as will be set out below in more detail (step S15).

If the normal comparison is involved in step S13, the resistor on the fourth line is extracted. In order to find the resistor connected to the connection line N2, the normal comparison is performed (step S14). In Step S16, the resistor on the connection line N2 emerging in the connection information items is compared and it is determined whether the comparison succeeds or fails. Since there is no resistor emerging on the connection line N2 upon comparison on the connection information items, the comparison is decided as "fail." In this case, control is returned back to the previous element (steps S17 and S18). A connection line N3 which remains as a connection line candidate on the third line is taken out and comparison is continued (steps S13 to S16). Again comparison is made on the resistor on the fourth line N3, but without success.

Again, control is returned back to a previous element and an attempt is made to compare the connection line on the third line, but no further candidate remains there. Control is returned further back to still another element, trying to search any proper candidate as the resistor on the second line and finding a resistor R2 as meeting such a condition. In this case, there are candidates N1 and N4 as the next element and first the candidate N1 is taken out for comparison but the comparison fails because no other resistor is connected to the connection line N1, and then the candidate N4 is taken out for comparison. Upon comparison on that resistor connected to the connection line N4, a resistor R3 is found and it is determined at step S17 that the comparison succeeds.

When comparison succeeds at step S17, determination is made, at each time, on whether or not the retrieved element is a final one (step S19). If no, control is returned back to step S12. If yes, a result of pattern comparison is delivered as an output (step S20). Since, in this case, the resistor R3 is the final element contained in FIG. 5, a combination of the resistor R2, connection line N4 and resistor R3 is found as meeting one condition and delivered as a result of pattern comparison to the terminal device 20 for display.

FIG. 9 shows one example of the final extracted objects obtained upon continued comparison and indicates three patterns, i.e., "R2·N4·R3", "R3·N6·R4" and "R4·N8·R5" patterns enclosed by the dash lines.

What is actually wanted in actual practice is the pattern "R4·N8·R5", that is, one of the three comparison results above, in which case the other two are determined to be in error. For the remaining two, a transistor is connected to that connection line in the pattern and it may be possible to adopt a method for making the comparison while eliminating any unnecessary portion. For the normal pattern comparison, it is possible to show such a comparison method. In such a case, it is possible to perform specific comparison at step S15, some of which are set out below.

As set out above, a first specific comparison (hereinafter referred to as a negative type comparison) example for comparing a portion of the transistor not connected to the connection line, that is, the method for making comparison while eliminating an unnecessary connection line, will be explained with reference to FIGS. 10 to 12.

FIG. 10 shows an example of negative type comparison whereby a negative designation is given to the search pattern. In FIG. 10, negative comparison is made on a dotted square labeled "NOT." In this case, since two resistors are connected to a connection line, the above method extracts portions not connected to the base of the transistor involved. That is, the arrangement of FIG. 10 means that a pattern where the base of the transistor is connected to the connection line is eliminated.

FIG. 11 shows one example of a search code synthesized by the search code synthesizing section 30 on the basis of search pattern data (FIG. 10) prepared by the search pattern editing section 10. The arrangement of FIG. 11 is substantially similar to that of FIG. 5 with respect to the first four lines.

From the fifth line in FIG. 11, negative comparison is started on a first block (since the negative comparison block may include a plurality of blocks, a corresponding number is attached to the same line) and ended at a seventh line. A sixth line in FIG. 11 indicates the contents of the negative comparison block, meaning that, for the ID number, there exists no transistor connected at the base to the node of a node 2. Similarly, the connection line at a third line shows a connection relation corresponding to the base of an NPN transistor. In the case where, in this example, not only the ID number but also other data items are in parentheses, they mean the condition under which, as in the case of FIG. 7, a node is connected to a terminal designated by that name.

For the first specific comparison, the same comparison operation as the normal comparison is performed until the two resistors and one connection line are found upon comparison. A subsequent operation, for example, an operation subsequent to finding, for example, a combination of R2·N4·R3, is as follows. An element to be next extracted is a transistor on a fifth line in FIG. 11 and, since the element is in the negative comparison block, a negative comparison routine is called. When an NPN transistor connected at the base to a connection line N4 ("N4" emerges on a second field of the connection information) is extracted on the connection data, it is found that TR2 satisfies an associated condition. If, within a comparison object, any one pattern corresponding to a pattern defined in the negative comparison block is found, block comparison fails at that portion contained in the negative comparison block. Therefore, control is returned back to a previous element and a resistor, other than R3, connected to N4 is extracted.

If comparison is similarly continued, in a combination of "R3·N6·R4", it fails because TR3 is found and eventually comparison succeeds only in the case of R4·R5 and a correct result is obtained as shown in FIG. 12.

For the search pattern shown in FIG. 4, two overlapped resistor combinations emerge as indicated by the dotted lines in FIG. 9 and, even if similar structural features are continuously present, it is not possible to extract the two as one unit. In the case where it is possible to find only portions exactly the same as an input search pattern, it is necessary that, in order to extract such a combined unit, a plurality of search patterns be prepared in a double, or a triple case when the number of search patterns prepared exceeds the number of patterns present, comparison cannot be done. Second specific comparison is adopted whereby it is possible to, by searching a repeated form of one pattern (hereinafter referred to as repeating comparison), find a whole repeated unit of that one pattern.

The repeating comparison (the second specific comparison) will be explained below with reference to FIGS. 13 to 17.

In FIG. 13, definition is given to a search pattern including a basic structure having two resistors, one connection line and one transistor and, out of these, one resistor, one connection line and one transistor which may be repeated on the search pattern editing section 10.

In FIG. 14, one resistor emerges on a second line with an ID number 1 and a repeating comparison block 1 starts at a third line (a number is attached because a plurality of blocks are included) and ends at a tenth line. In FIG. 14, the third to fifth lines show a repeating base structure and a sixth line shows that an item defining a relative relation between two basic structures starts there. In FIG. 14, the sixth to ninth lines show the second basic structure for defining the relative connection relation and its connection information.

Figure 16:
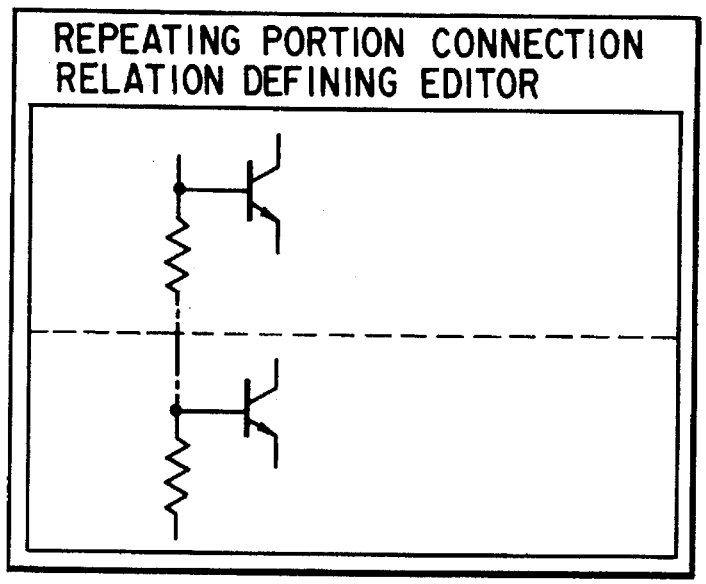
FIG. 16 is a view showing, for example, a repeating structure defined, by a repeating portion connection defining editor, in the repeating structure of FIG. 13.

In general, the search pattern, being simply represented as shown in FIG. 13, does not uniquely determine a repeating structure as to how the basic structure is repeated, that is, it is not known how the basic structure is repeated in any specific form in FIG. 15A or in FIG. 15B or how the basic structure is repeated in any specific different form. The repeating structure can be specified by utilizing the above-mentioned supplementary information editing unit 55 as an editor for inputting information particularly required in the case of the repeating comparison as shown in FIG. 16 and defining a relative connection relation between the two repeating basic structure.

The repeating comparison action is as follows. Since normal comparison is done until one basic structure is found, explanation will be given below from where a first resistor R2 and pattern "N4·R3·TR2" as the basic structure are found.

Figure 17:
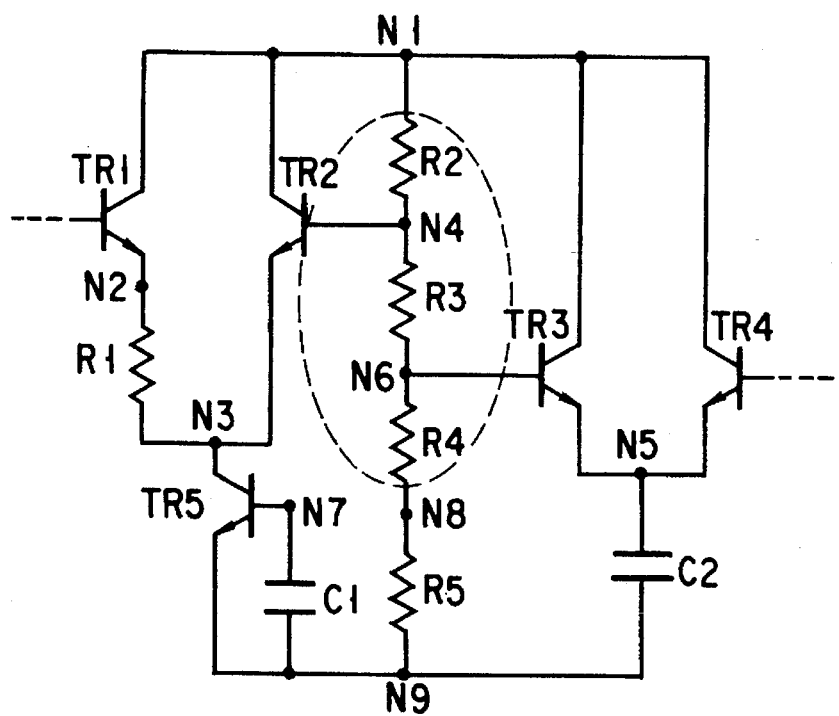
FIG. 17 is a view showing, for example, a display output when repeating type comparison is performed on the electronic circuit of FIG. 6.

For the repeating comparison, since comparison is made on the repeating basic structure on the target object 90, again the first element "connection point" of the basic structure is extracted. From the relative connection relation defined by a repeating structure editing portion, not shown, provided on the search pattern editing section 10, the comparison engine 40 finds a connection line N6 as being connected to a resistor (R3 in this case) in the already found basic structure. Further, R4 and TR3 are found, upon comparison, as a resistor connected to the connection line N6 and NPN transistor connected at the base to N6, respectively. By so doing, comparison succeeds on the second basic structure. As the element of the third basic structure, a connection line N8 and resistor R5 are extracted, but comparison fails because there is no NPN transistor connected at the base to a connection line N8. Eventually, for the repeating comparison, a double basic structure is successfully extracted, thus obtaining a result of pattern comparison as shown in FIG. 17.

OR type comparison will be explained as third specific comparison, below, with reference to FIGS. 18 to 20.

In FIG. 18, a partial feature (C) comprised of "TR1·N2·R1·N3·TR2" and partial feature (D) comprised of "TR3·N5·TR4" show functionally the same differential type amplifiers and are very similar in arrangement to each other except the resistor, but if the same type alone is to be compared it is necessary to describe them as separate search patterns. Therefore, the search pattern is described, as shown in FIG. 19, with an OR type comparison portion designated. For subblocks (1) and (2) in a dotted rectangular configuration labeled "OR", comparison succeeds if either one of them is present. Here the subblock (1) is shown as being empty.

FIG. 20 shows one search code form synthesized by the search code synthesizing section 30 on the basis of the search pattern data (FIG. 19) edited by the search pattern editing section 10. In FIG. 20, the third to sixth lines show the OR type comparison block where the first OR type subblock is at the fourth and fifth lines and the demarcation mark of the subblock is at the sixth line. Normally the constituent element of the second subblock is subsequently arranged, but since, in this case, it is not occupied there the seventh line immediately follows, showing the end of the OR type comparison block. In FIG. 20 the eighth and ninth lines show the normal comparison block.

The OR type comparison action is as follows. As the first element, an NPN transistor is extracted and TR1 is taken out. Next comparison is done on the OR type comparison block, first examining the OR type comparison block (1) and taking out a pattern N2·R1. Next a pattern N3·TR2 is taken out on normal comparison, leading to success. Since there is no node through which NPN transistor at the ninth line and connection line at the eighth line are taken out, control is again returned back to the OR type comparison block. Since there is no specific node taken out of the block (1), control is moved to the block (2). Here, since the block (2) is empty, comparison succeeds without doing anything. Control goes ahead, but comparison fails because there is no NPN transistor connected to the connection line N2 taken.

At the time when TR3 is taken as the initial NPN transistor, the following action is done. A search is made for the OR type comparison block and N5 is taken out as a connection line at the fourth line of the subblock (1), but this comparison fails because there is no resistor connected to N5. Next, comparison is made on the subblock (2), but the block above is not occupied and success is gained. N5 and TR4 are taken out as the connection line at the eighth line and NPN transistor at the ninth line, respectively, leading to success. By so doing, it is possible to represent the presence and absence of a resistor with one search pattern.

FIG. 21 is a block diagram showing an arrangement of a circuit pattern comparison apparatus according to a second embodiment of the represent invention. In FIG. 21, the same reference numerals are employed to designate parts or elements corresponding to those shown in FIG. 1. Any further explanation is, therefore, omitted.

The circuit pattern comparison apparatus of the second embodiment includes a search pattern input section 12 and a comparison order designating section 14 as a search pattern editing section 10 with a terminal device 20; a normal comparison order knowledge input section 60; a normal comparison order knowledge file 65; a comparison order synthesizing knowledge input section 70; a comparison order synthesizing knowledge file 75; a comparison order synthesizing section 32 and comparison order editing section 34 in a search code preparing section 30; and a comparison engine 40.

The search pattern input section 12 enters a search pattern, that is, a pattern desired by the user to be extracted, and, in more detail, an editor is employed for preparing the search pattern and editing it as required.

FIG. 22 shows one form of a search pattern comprising a circuit network having four transistors Q1 to Q4 and a resistor R in a manner shown. The search pattern includes not only such a circuit network configuration but also condition data, such as "R>=10 Ohms" and "left upper Q1 and right upper Q2 are of the same type". Like the first embodiment, the second embodiment will be explained below, assuming that there is no such condition present.

The comparison order designating section 14 comprises an editor for designating how each node in a search pattern entered by the user from the search pattern input section 12 is compared in any specific order. Here the comparison order is designated, by the comparison order designating section 14, as an individual designation.

FIG. 23 shows one example for designating the comparison order to the search pattern shown in FIG. 23, that is, the designation of the comparison order of left upper Q1→left lower Q3→right upper Q2→right lower Q3→middle R.

In the case where there are references on which designation is given to the normal comparison order not depending upon any specific search pattern, the normal comparison order knowledge input section 60 initially enters them as normal comparison order knowledge. For the comparison order stored as the normal comparison order knowledge it is possible to omit the individual designation at the comparison order designation section 14. The normal comparison order knowledge is stored in the normal comparison order knowledge file 65.

The following shows one example of the normal comparison order knowledge.

(a) Comparison is first made on a node connected to an "extracted" node.

(b) When a transistor is present as an "extracted" node, comparison is made on a node connected to a node connected to the emitter or collector, not the base, of the transistor.

(c) Of a transistor and resistor, the transistor is first extracted.

(d) Retrieval is first made on a node more connected to the "extracted" nodes.

The normal comparison order knowledge is such that the earlier described one is more important than the later described one and has priority over the latter in the application of the knowledge. On the basis of this knowledge the comparison process of FIG. 22 will be done as follows:

(1) Since there is no "extracted" node, the step (c) is applied and, in this case, one proper transistor is selected from among four transistors. Here let it be assumed that the left upper transistor Q1 is selected.

(2) The step (a) is applied and the left below transistor Q1 and middle resistor R remain as candidates. Then the step (c) is applied and the left transistor Q3 is found as the second element.

(3) The step (a) is applied and the right lower transistor Q2 and middle resistor R remain and further the step (b) is applied and the middle resistor R is extracted as the third element.

(4) The step (1) is applied and the right lower transistor Q3 and right upper transistor Q2 remain as candidates. Further the step (d) is applied and the right lower transistor Q4 is extracted as the fourth element.

(5) The right upper transistor Q2 is extracted as a final element (the fifth element).

The pattern comparison order designated by the user in the comparison order designating section 14 and normal comparison order knowledge extracted from the normal comparison order knowledge file 65 are combined by the comparison order synthesizing section 32 to provide a new comparison order.

The comparison order synthesizing knowledge input section 70 enters the comparison order synthesizing knowledge for designating a method for synthesizing a new comparison order in the comparison order synthesizing section 32. The entered comparison order synthesizing knowledge is stored in the comparison order synthesizing knowledge file 75.

The following is one form of the comparison order synthesizing knowledge.

(A) If the comparison order is designated by the user, priority is given to it.

(B) If the comparison order is not given by the user, the comparison order is designated based on the normal comparison order knowledge.

(C) If the step (B) is not determined, proper designation is made by the system.

Let it be assumed that the comparison order synthesizing knowledge is filed in the comparison order synthesizing knowledge file 75, that the comparison order is partially designated by the user as shown in FIG. 24 and that the normal comparison order knowledge as exemplified at the above sections (a) to (d) is stored in the normal comparison order knowledge file 65. In this case, a new comparison knowledge order synthesized by the comparison order synthesizing section 32 is designated as follows:

(1) By the step (A) the left upper transistor Q1 is determined as the first element.

(2) Since no further designation is made by the user, designation is effected, by the step (B), based on the normal comparison order knowledge.

(3) The left lower transistor Q3 is designated as the second element based on the normal comparison knowledges (a) and (c).

(4) The middle resistor R is selected as the third element by (1) and (2) above.

(5) The right lower transistor Q4 is selected by (1) and (4).

(6) The right upper transistor Q2 is selected as a final (fifth) element.

The comparison order thus designated is as shown in FIG. 25, that is, Q1→Q3→R→Q4→Q2.

If comparison, being performed with the comparison order based on the normal comparison order knowledge, involves many times, it may be possible to enhance comparison efficiency by editing (correcting) only those portions, at the comparison order editing section 34, which may preferably have their order changed or only those portions which requires the specific order with which comparison is performed.

Further, in the example above, the comparison order is Q1→Q3→R→Q4→Q2, if the left lower transistor Q3 is specifically conditioned in that arrangement and it seems preferable in this connection to first extract the transistor Q3, then comparison efficiency can be enhanced by correcting the comparison order of Q3→Q1→R→Q4→Q2 at the comparison order editing section 34.

The comparison order information thus obtained is input to the comparison engine 40 and, in accordance with the comparison order, a search pattern as shown in FIG. 22 is extracted from the circuit network (i.e., electronic circuit in this embodiment) of the target object.

The present invention is not limited to the above embodiments and various changes or modifications can be made without departing from the spirit and scope of the present invention.

In the first embodiment, for example, the number of times the comparison operation is performed upon repeating comparison can be restricted to an upper and a lower limit and, if, in this case, the number of the repetitions departs from these restricted limits, it may be possible that the comparison involved leads to failure.

In the case where the same pattern area is overlappingly extracted upon repeating comparison, it may lead to success only when the number of repetitions is maximal. By so doing, it can avoid such overlapping.

In the OR type comparison of the first embodiment, the number of subblocks, though being set to two, may be several in actual practice. Further, if two subblocks are involved upon OR type comparison and contain any empty subblock, comparison can be made as if it were actually performed. In this case, it is to be noted that the occupied subblock is treated as being omissible.

A routine for achieving the specific comparison method, such as the negative comparison and repeating type comparison, and an editor, such as the repeating structure editing section, for entering information necessary to perform the comparison method can be freely registered and started as the above-defined comparison method describing unit 50 and supplementary information editing unit 55 when the start is made from the comparison engine and search pattern editing section. By so doing, it is possible to readily add a new specific comparison method at a later time.

In the first embodiment, the kinds of nodes and those information items of connection to other nodes are dealt as the condition for each node in the search code, the condition of the attribute value of the respective nodes, comparison of the attribute values of the nodes, and so on, are added as the conditions under which comparison is made and it is possible that, if these conditions are satisfied, comparison succeeds.

In order that, in the second embodiment, those portions not completely determined in their comparison order by the normal comparison order knowledge stored in the normal comparison order knowledge file 65 may be sequentially designated by the user, designation can be made with the comparison order synthesizing knowledge extracted from the comparison order synthesizing knowledge file 75.

Similarly, the comparison order designated by the user at the comparison order designating section 14 can be checked/corrected with the normal comparison order knowledge extracted from the normal comparison order knowledge file 14.

Some of the comparison order generated with the normal comparison order knowledge extracted from the normal comparison order knowledge file 65 can be corrected/modified by the comparison order editing section 34.

In the first and second embodiments, the connection line is treated as a node so as to represent an electronic circuit, it is possible to proceed with such data items by treating only those elements, such as resistors and transistors, as being nodes. It is also possible according to the present invention to include, as an object of comparison, an electric power system other than an electric circuit, a water supply/sewerage circuit, a telephone circuit network, a computer circuit network or a mechanical configuration.

In the first and second embodiments, the electric circuit has been explained as being the object of comparison, it is possible according to the present invention to include, as an object of the present invention, an electric power system, a telephone circuit network, a water supply and sewerage circuit, a computer circuit or a mechanical configuration.

The first and second embodiments have been individually and separately explained above, it is possible to combine the first and second embodiments and therefore to perform more effective pattern comparison through such a combination.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A circuit pattern comparison apparatus for extracting portions matched to a designated predetermined search pattern from an object of comparison represented by a circuit network having a set of nodes and node-to-node arcs or links, comprising:

search pattern editing means for schematically describing said designated predetermined search pattern having a plurality of nodes;

comparison order designating means for designating a comparison order of the nodes contained in the designated predetermined search pattern;

search code synthesizing means for synthesizing at least one search code by subjecting, to code conversion, said designated predetermined search pattern schematically described by said search pattern editing means;

comparing means for comparing the designated predetermined search pattern to the object of comparison utilizing the at least one search code; and extracting means for extracting at least one portion of the object of comparison matched to said designated predetermined search pattern.

2. A circuit pattern comparison apparatus according to claim 1, wherein said search pattern editing means includes means for schematically designating, in the search pattern, a given pattern which is contained in said designated predetermined comparison pattern so as to be eliminated from the object of comparison by negative comparison.

3. A circuit pattern comparison apparatus according to claim 1, wherein said search pattern editing means includes means for schematically designating, in said designated predetermined search pattern, a given pattern to be extracted by repeating comparison.

4. A circuit pattern comparison apparatus according to claim 3, wherein said search pattern editing means includes means for schematically designating, in said designated predetermined search pattern, a repeating structure representing a connection relation for the repeating comparison.

5. A circuit pattern comparison apparatus according to claim 3, wherein said search pattern editing means includes means for designating at least one of upper and lower limits for the number of times comparison is repeated by said repeating comparison.

6. A circuit pattern comparison apparatus according to claim 1, wherein said search pattern editing means includes means for schematically designating a given position pattern of said designated predetermined search pattern as either one of a plurality of patterns by OR type comparison.

7. A circuit pattern comparison apparatus according to claim 6, wherein said search pattern editing means includes means for schematically designating any omissible pattern in said designated predetermined search pattern.

8. A circuit pattern comparison apparatus according to claim 1, further comprising:

a predetermined comparison method describing unit for defining a desired comparison method; and a supplementary information editing unit for providing supplementary information required for comparison by the predetermined comparison method describing unit.

9. A circuit pattern comparison apparatus according to claim 1, wherein said comparing means includes means for comparing said designated predetermined comparison pattern from the object of comparison in accordance with the comparison order designated by said comparison order designating means.

10. A circuit pattern comparison apparatus according to claim 9, wherein said comparing means includes means for receiving a search code synthesized by said search code synthesizing means and for comparing the object of comparison portions matched to said designated predetermined search pattern represented as the search code.

11. A circuit pattern comparison apparatus according to claim 10, wherein said search pattern editing means includes means for schematically designating a pattern for OR comparison which can extract a given position pattern of the search pattern as any one of a plurality of patterns.

12. A circuit pattern comparison apparatus according to claim 11, wherein said search code synthesizing means includes means for converting a given position pattern to a search code contained as an OR type comparison block and said comparing means includes means for determining that, when the given position pattern is matched to any of the plurality of patterns, comparison succeeds.

13. A circuit pattern comparison apparatus according to claim 10, further comprising a predetermined comparison method describing unit for defining a desired comparison method, and a supplementary information input unit for inputting supplementary information necessary for extraction by said predetermined comparison method describing unit.

14. A circuit pattern comparison apparatus according to claim 13, wherein said comparing means includes means for comparing said designated predetermined search pattern in accordance with a comparison method defined by said comparison method describing unit and said search pattern editing means includes means for activating said supplementary information input unit and for designating a predetermined unit for performing comparison in accordance with said predetermined comparison method describing unit.

15. A circuit pattern comparison apparatus according to claim 14, wherein said search pattern editing means includes means for designating, in said designated predetermined search pattern, a given pattern which is contained in the search pattern so as to be eliminated from the object of comparison by negative comparison.

16. A circuit pattern comparison apparatus according to claim 15, wherein said comparison code synthesizing means includes means for converting the given pattern which is schematically designated with said designated predetermined search pattern editing means for negative comparison to a search code contained as a negative comparison block and said comparing means includes means for determining that, when a pattern is not contained in the negative comparison block, comparison fails.

17. A circuit pattern comparison apparatus according to claim 10, wherein said search pattern editing means includes means for schematically designating, in said designated predetermined search pattern, a given pattern for repeating comparison for repetitively searching the given pattern.

18. A circuit pattern comparison apparatus according to claim 17, wherein said searching pattern editing means includes means for schematically designating, in said designated predetermined comparison pattern, a repeating structure representing a connection relation for repeating comparison.

19. A circuit pattern comparison apparatus according to claim 18, wherein said search code synthesizing means converts a pattern to be repetitively compared and a repeating structure to a search code contained as a repeating comparison block and said comparing means includes means for determining that, when a pattern contained in the repeating comparison block is repeated a predetermined number of times, comparison succeeds.

20. A circuit pattern comparison apparatus according to claim 18 or 19, wherein said comparing means includes means for determining that, when patterns to be extracted are repeated a predetermined number of times in an overlapping way, comparison succeeds only in the case where the number of repetitions is maximal.

21. A circuit pattern comparison apparatus according to claim 1, further comprising:

normal comparison order knowledge input means for inputting normal comparison order knowledge independent of an individual pattern for the comparison order; and comparison order synthesizing means for combining the normal comparison order knowledge input from the normal comparison order knowledge input means and the comparison order designated by said comparison order designating means and for synthesizing a new comparison order, wherein said comparing means includes means for comparing said designated predetermined comparison pattern from the object of comparison in accordance with the new comparison order synthesized by said comparison order synthesizing means.

22. A circuit pattern comparison apparatus according to claim 21, further comprising comparison order synthesizing knowledge input means for inputting comparison order synthesizing knowledge for designating a method for synthesizing the new comparison order by said comparison order synthesizing means.

23. A circuit pattern comparison apparatus according to claim 21, further comprising comparison order editing means for performing editing on the new comparison order synthesized by said comparison order synthesizing means.

24. A circuit pattern comparison apparatus according to claim 1, wherein said search pattern editing means includes means for schematically designating an omissible pattern in said designated predetermined search pattern.

25. A circuit pattern comparison apparatus according to claim 24, wherein said search code synthesizing means includes means for converting the omissible pattern to a search code contained as an omissible comparison block, and said comparing means includes means for determining that comparison succeeds irrespective of whether or not a matched pattern is found relative to the omissible block.

26. A circuit pattern comparison apparatus for comparing a designated search pattern to an object of comparison represented by a circuit network having a set of nodes and node-to-node arcs or links, comprising:

search pattern input means for inputting a predetermined search pattern;

comparison order designating means for designating a comparison order of nodes contained in the predetermined search pattern input by said search pattern input means; and comparing means for comparing the predetermined search pattern to the object of comparison in accordance with the comparison order designated by said comparison order designating means.

27. A circuit pattern comparison apparatus for extracting a predetermined comparison pattern from an object of comparison represented by a circuit network having a set of nodes and node-to-node arcs or links, comprising:

search pattern input means for inputting the predetermined comparison pattern;

comparison order designating means for designating a comparison order of nodes contained in the predetermined search pattern input by said search pattern input means;

normal comparison order knowledge input means for inputting normal comparison order knowledge independent of an individual pattern for the comparison order;

comparison order synthesizing means for combining the normal comparison order knowledge input by said normal comparison order knowledge input means and the comparison order designated by said comparison order designating means to synthesize a new comparison order; and comparing means for comparing the predetermined search pattern to the object of comparison in accordance with the new comparison order synthesized by said comparison order synthesizing means to extract at least one portion of the object of comparison matched to said predetermined search pattern.

28. A circuit pattern comparison apparatus according to claim 27, further comprising comparison order editing means for performing editing on the new comparison order synthesized by said comparison order synthesizing means.

29. A circuit pattern comparison apparatus according to claim 27, further comprising comparison order synthesizing knowledge input means for inputting comparison order synthesizing knowledge for designating a method for synthesizing a new comparison order in said comparison order synthesizing means.

\* \* \* \* \*